United States Patent [19]

Champet et al.

[11] Patent Number: 4,958,982
[45] Date of Patent: Sep. 25, 1990

[54] DEVICE FOR TRANSFERRING ITEMS

[75] Inventors: Gérard Champet, Saint Just Saint Rambert; Gilles Charpille, Saint Etienne, both of France

[73] Assignee: Centre Stephanois de Recherches Mecaniques Hydromecanique et Frottement, France

[21] Appl. No.: 315,265

[22] Filed: Feb. 24, 1989

[30] Foreign Application Priority Data

Feb. 26, 1988 [FR] France ................... 88 02888

[51] Int. Cl.⁵ .............................................. B65G 65/00
[52] U.S. Cl. ................... 414/751; 414/404; 414/417; 294/87.1
[58] Field of Search ............ 414/404, 405, 417, 450, 414/451; 294/87.1; 74/29, 33, 109

[56] References Cited

U.S. PATENT DOCUMENTS

| | | | |
|---|---|---|---|
| 3,949,891 | 4/1976 | Butler et al. | 414/405 |
| 4,286,380 | 9/1981 | Blount | 294/87.1 X |
| 4,832,180 | 5/1989 | Ferrero | 294/87.1 X |

Primary Examiner—Robert J. Spar
Assistant Examiner—Donald W. Underwood
Attorney, Agent, or Firm—Eric P. Schellin

[57] ABSTRACT

The device is outstanding in that the gripping structures (1) are independent while each being servo-controlled by a system of components (10)-(9) fitted to a drive structure being likely to carry out the relative movement of gripping structures (1) with respect to one another in order to vary their pitch in a continuous manner so that their spacing is in register with that of the notches where the items should be transferred, the assembly of gripping structures being mounted on a support plate which can be moved in translation and height.

5 Claims, 4 Drawing Sheets

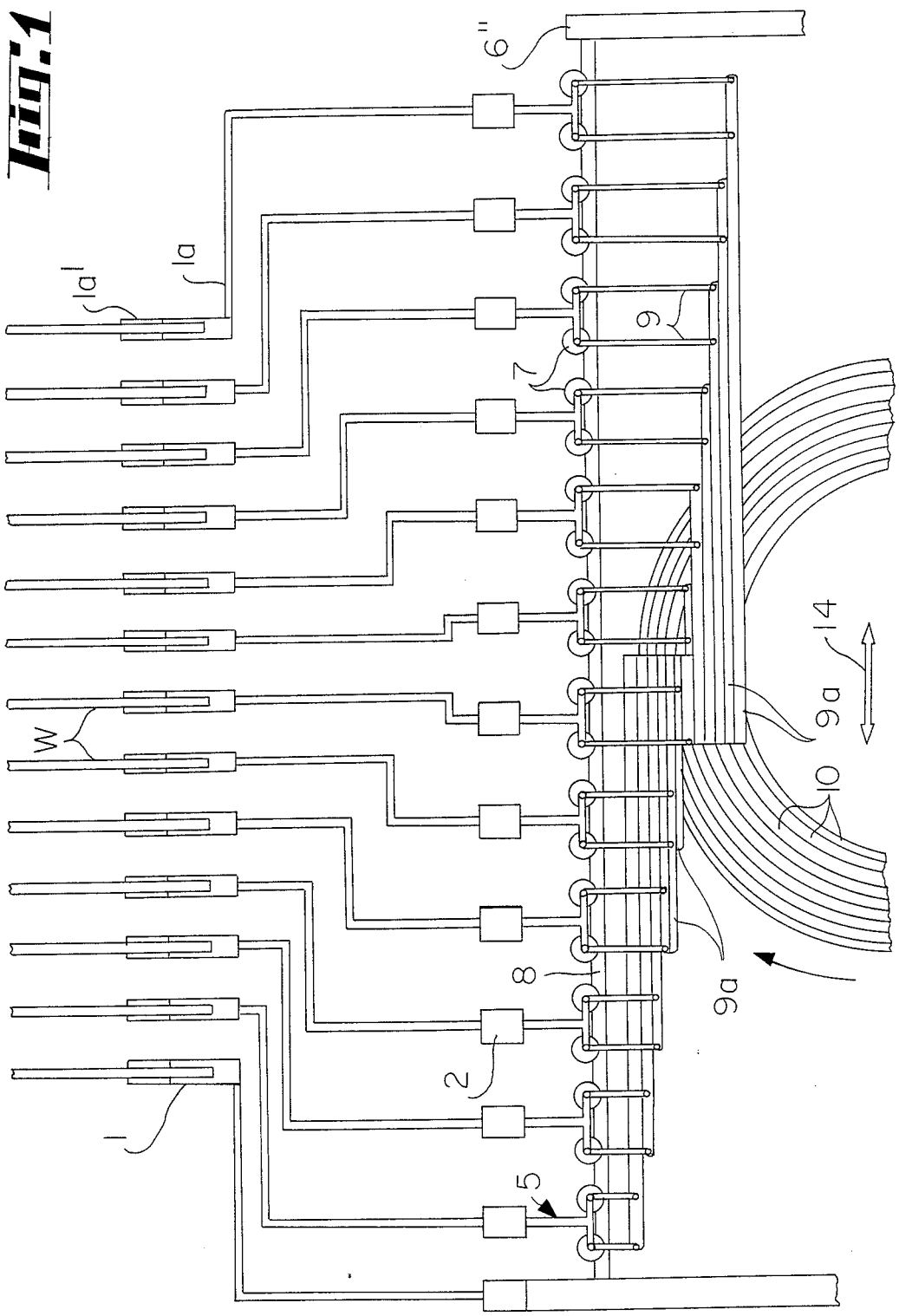

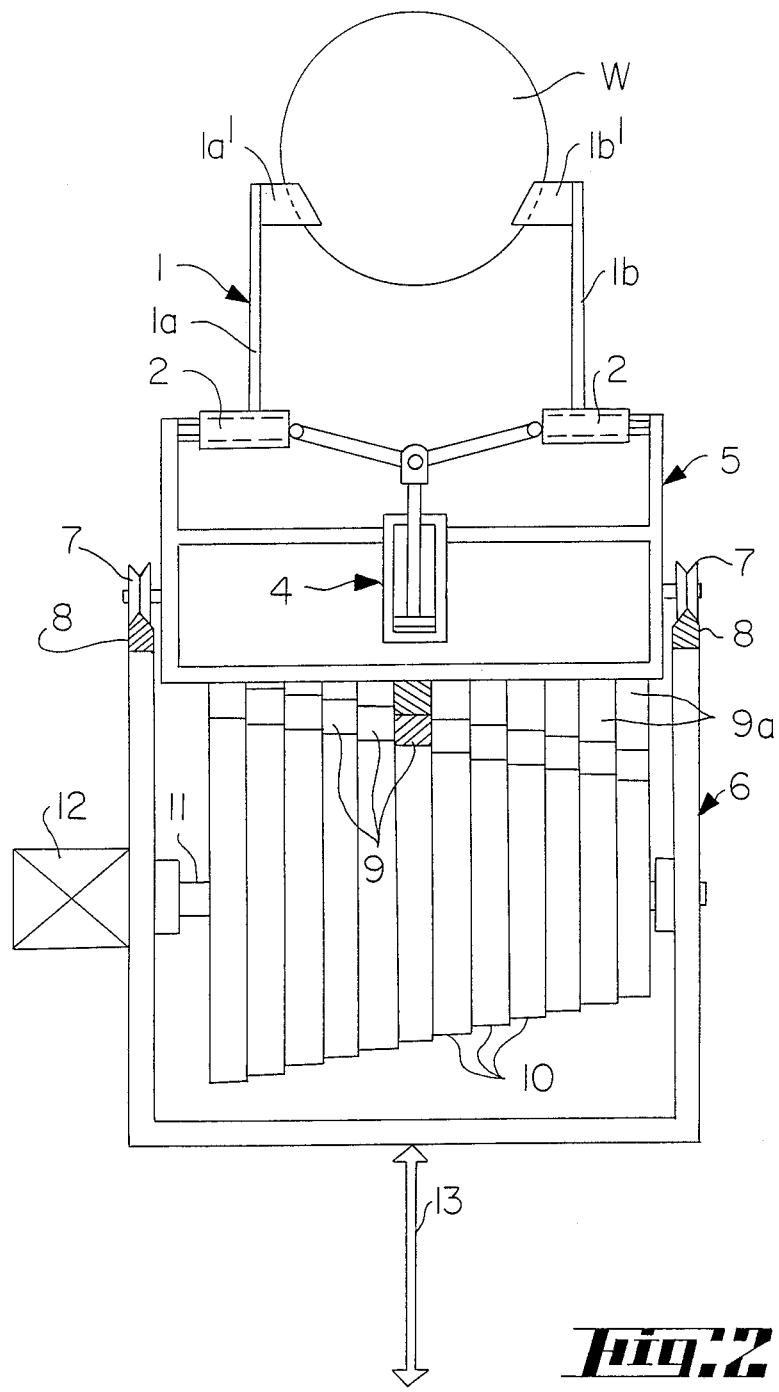

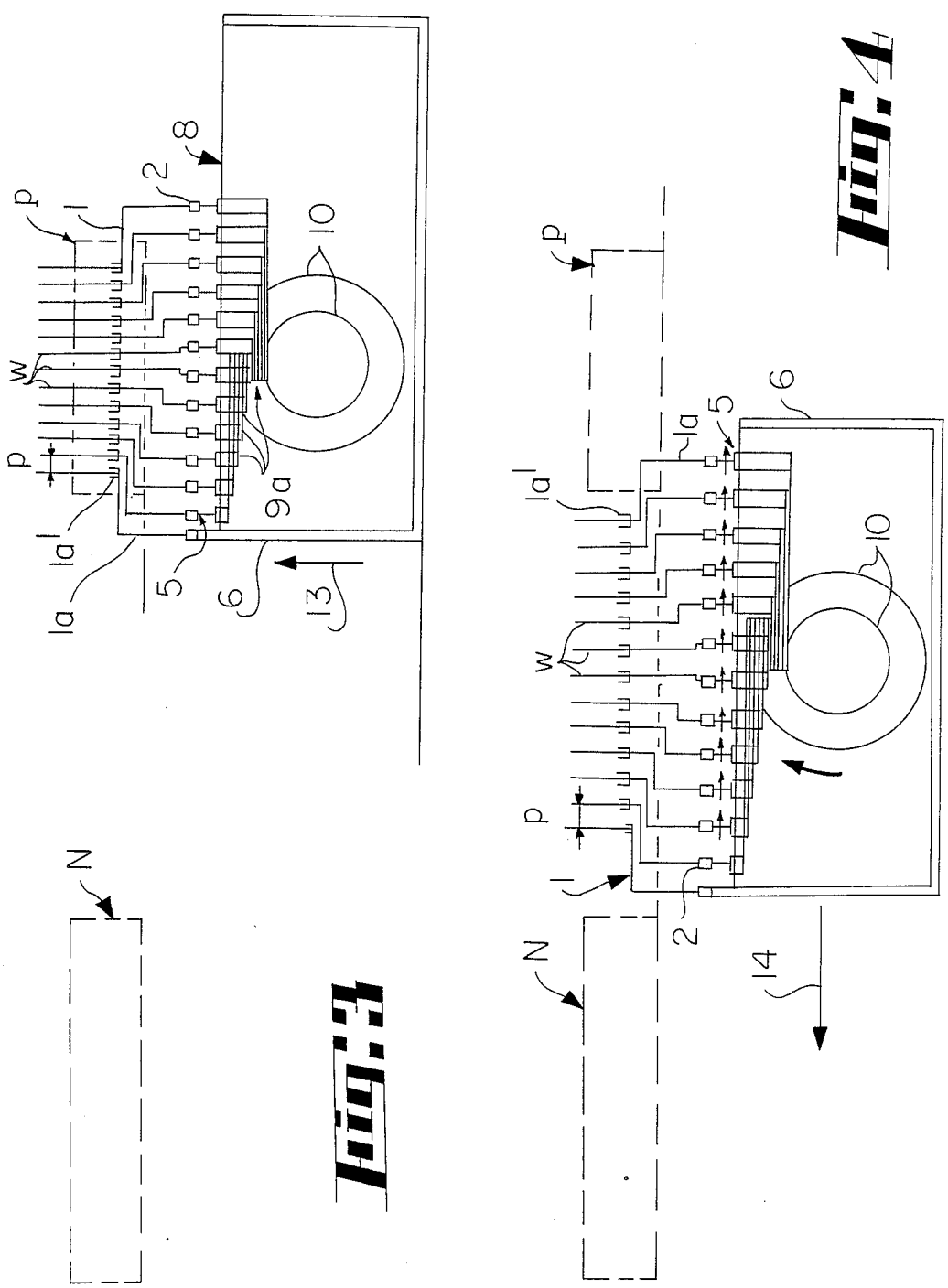

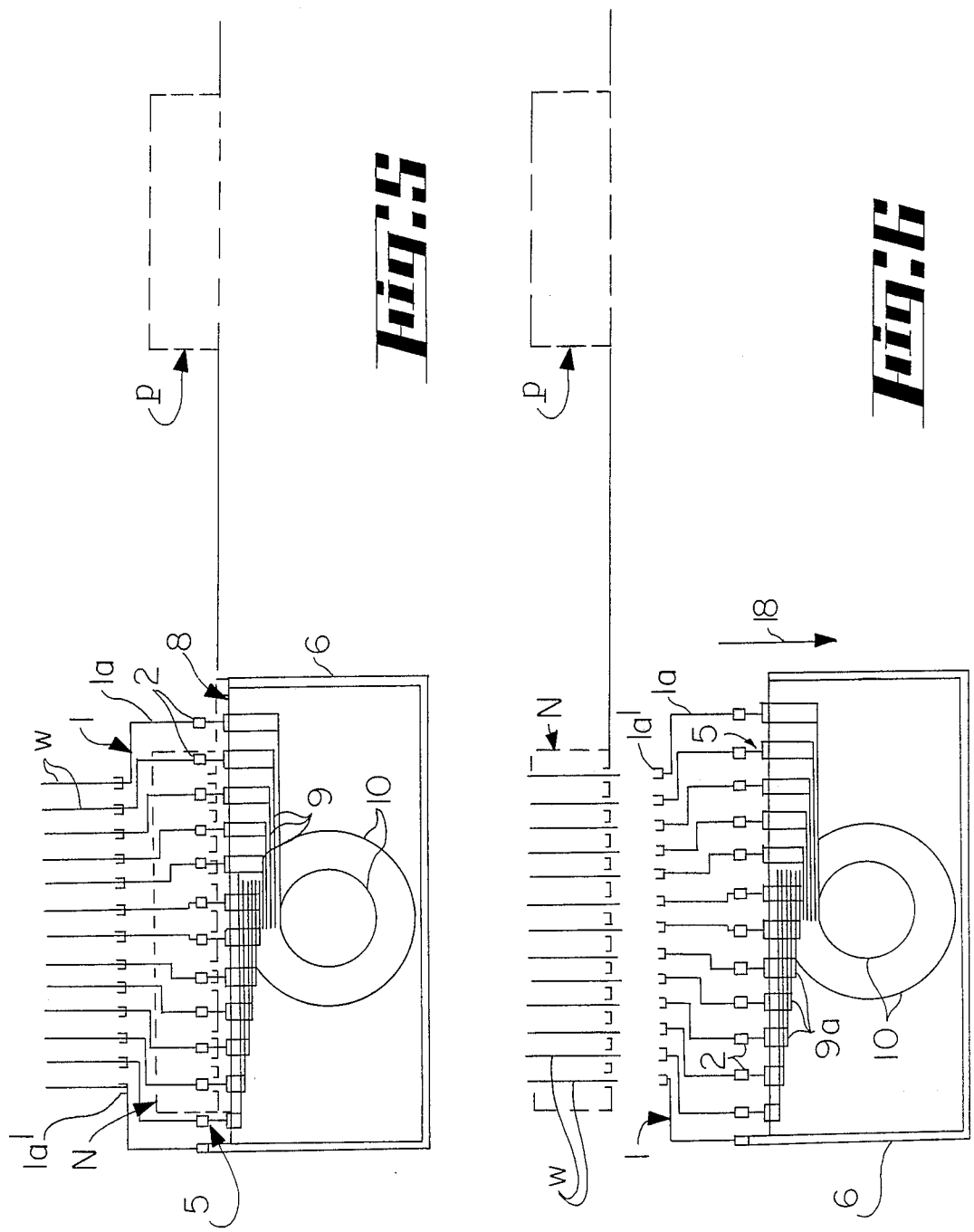

DEVICE FOR TRANSFERRING ITEMS

Device for transferring items from at least one support to at least one other.

This invention relates more particularly, however not limitatively, to the transfer of silicon wafers from a carrier to a boat and vice versa. In fact, the wafers or other items when in the processing phase, are vertically positioned in notches in a carrier, the said notches each being offset by the same spacing.

Before placing these wafers into a diffusion furnace for example, the wafers have to be transferred into a boat usually made of a refractory material. In a known way, a boat has side notches in order to vertically hold the wafers in an even and orderly manner however with a pitch or spacing which is different to that of the carrier.

This transfer operation is delicate. Besides the fact that it is necessary to be careful not to contaminate wafers by the deposit of foreign particles, it is necessary to consider, as far as possible, this difference of pitch or spacing between the notches of the carrier and the boat.

Given these conditions, the transfer of the wafers from the carrier to the boat and vice versa is very often carried out individually with suitable means. It can be ascertained that this is neither rational or adapted to automatic processing of wafers for example.

The problem brought up is therefore to be able to provide the gripping of all or a certain number of wafers contained in the carrier (or in the boat) then to provide the transfer of all a given number of wafers gripped in the boat or (or carrier) whilst taking the variation of the pitch which exists between the carrier and boat, into account.

In order to overcome this problem, the applicant has come up with a solution as shown in patent EP 0.228.973 of which he is the holder. For the main part, this patent teaches a device which comprises several gripping mean cooperating with all the wafers or other items. These gripping means are for example, fixed to the ends of a interrupted coil of hollow helical tubes integral with supports, fastened to drive systems connected to electric motors.

Such a solution is somewhat delicate to implement from an industrial point of view and it is not entirely satisfactory. Furthermore, the design of the implementation means may produce risks of wafers being contaminated.

In order to overcome these disadvantages and solve the problem brought up regarding the variation of pitch during the transfer of the wafers or other items, in a simple, efficient and rational manner, without the risk of contamination, the invention offers a solution which implements a device, outstanding in that the said gripping means are independent whilst each being servocontrolled by a system of components fitted to a driving means being likely to carry out the relative movement of gripping means in respect to one another in order to vary their pitch in a continuous manner so that their spacing is in register with that of the notches where the items should be transferred, the gripping means and the pitch variation system being mounted on a support plate which can be moved in translation and height and is situated under the supports.

In an advantageous manner, the problem brought up is overcome by the following features:

the system of components is made up of stepped gears cooperating with components acting as a rack.

each gripping means is connected to a gear by a component acting as a rack so that each means corresponds to a gear with a different diameter and teeth to enable a different movement in translation of the gripping means in order to correspond with the variation of pitch desired when the stepped gears are turned.

each of the gripping means, with the exception of that situated at one of the ends of the assembly made up of the said means, is connected to an independent carriage, mounted so as to be capable of moving in translation over part of the support plate, each of the said carriages being coupled to a gear through the component acting as a rack.

the pitch diameters, Dp of the different stepped gears for each of the gripping means, numbered from 2 to n, are as follows:

for gripping means No. 2: $Dp_2 = M_2 \, Z_2$ for gripping means No. 3: $Dp_3 = Dp_2 + \text{constant}$ for gripping means No. n: $Dp_n = Dp_{n-1} + \text{constant}$ M being the module of teeth of the gear and corresponding rack whereas Z is the number of teeth of the gear the stepped gears are mounted on a common shaft turned in either direction by a programmable motor of the numerical axis type.

In order for the device to be provided with the maximum of reliability, it appeared necessary to check one of the supports, especially the boat or more particularly, the pitch of the notches, the positioning of the first notch and the deformation of the boat.

The problem brought up is overcome by means of the proximity switch mounted on a horizontal arm linked to a guiding table by a component likely to provide the height adjustment of the said switches which are fitted to a drive means in order to be moved along the boat.

Other characteristics will appear as the description proceeds.

The invention is described below in more detail by the help of the accompanying drawings, wherein:

FIG. 1 is a front view of the device,

FIG. 2 is a side view corresponding to FIG. 1,

FIG. 3, 4, 5 and 6 are purely schematic views showing the transfer principle according to the invention.

As indicated, the device is particularly well adapted for the transfer of silicon wafers (w) from at least one carrier (P) to at least one boat (N), without excluding the transfer of other items with a variation of pitch during transfer.

Given these conditions, the device can be mounted onto any type of known machine, comprising, for example, and mainly, of a drum supporting the carriers particularly with a loading/unloading station for the carriers, a station to position the wafer flats, a loading or unloading station for the wafers from the carrier, a manipulator in order to transport wafers from the drum to a gripping station and vice versa, these stations being likely to be fitted with a tranfer device. This wafer processing machine is not described in detail as it does not form part of the specific object of the invention.

The device comprises several independent gripping means likely to simultaneously cooperate with all the wafers positioned in a carrier or boat or with only part of the said wafers. For information, there are thirteen gripping means with the possiblity of independently gripping 1 to 13 wafers.

As shown in FIG. 1, each gripping means consists of a gripper (1) comprising two profiled arms (1a) and (1b), placed opposite one another and each cooperating at their base with a guiding component (2) fitted with a system of connecting rods (3) operated by a cylinder (4) or another operating component in order to provide the bringing together or separation of the two arms corresponding to the opening or closing position of the gripper. The end of the arms (1a) and (1b) have tips (1a-1-1b1) of teflon, polypropylene or other materials in which a notch is made in order to guide the wafers when they are gripped by the edge. It is to be noted that arms (1a) and (1b) are opened by the actuating of the cylinder or another operating component, whereas the said arms can be closed by a spring.

According to the invention, in a significant manner, each of the grippers (1) thus defined, is connected at its bottom part to an independent carriage (5), mounted, capable of guided movement in translation over a support plate (6). For example, each carriage (5) supporting a gripper (1), has wheels (7) cooperating with parallel guide rails (8) which make up part of the plate (6).

It is to be noted that the gripper (1—1) at one of the ends of the gripping means assembly, is mounted on the support plate (6) with a fixed translation position. Considering the assembly of each gripper (1) (with the exception of gripper (1—1) on independent carriages (5), the said gripper can be moved in translation over the plate (6) with respect to one another in order to consequently vary their spacing.

With this aim in mind, each of the gripper support carriages is connected through a bar (9) acting as a rack (9a) with a gear (10). A gear with a different diameter and teeth corresponds to each gripper (1) so that, under the turning effect of the stepped gears thus defined, a different concomitant translation movement of the gripper support carrriage results ion order to correspond to the variation of pitch desired.

The stepped gears (10) are centered on sealed ball bearing supported by a shaft (11), servo-controlled directly or through a pulley and toothed belt drive in particular, with a Infranor numerical axis type programmable drive motor (12), in order to turn the said gears in either direction according to a determined angular movement. The gears (10) and corresponding racks (9a) have straight teeth.

These gear and rack drives are determined in the following manner, remembering that the first gripper (1-1) is fixed in translation so that it is not fixed to a gear/rack drive through a carriage.

If M is the module of the teeth of the gear and the rack, Z the number of teeth of the gear and Dp the pitch diameter of the gear, of each of the grippers numbered 2 to n, the corresponding pitch diameter of the gear shall be:

for the gripper No. 2: $Dp2 = M2\ Z2$
for the gripper No. 3: $Dp3 = Dp2 + constant$
for the gripper No. 4: $Dp4 = Dp3 + constant$
for the gripper No. n: $Dpn = Dpn - 1 + constant$ If the device comprises, as indicated, 13 grippers, there would be 12 gears (10) and racks (9a).

In order to carry out the different movements required to transfer wafers, the support plate (6) is servo-controlled by drive means, in order to be moved vertically in translation.

For example, the vertical movement symbolised by the arrow (13) is provided by a DC motor, a pulley and toothed belt drive and ball screws to move the wafers upwards either to take them out of the notches of a comb or the boat or to move above the wafers already positioned (in the case of tests or baffles).

These movements in height are checked by inductive sensors with precision which is not necessarily strict.

The longitudinal movement in translation symbolised by the arrow (14) is provided by a DC motor, a pulley and toothed belt drive and ball screws in order to load a boat from a comb or unload it towards the comb. All these longitudinal movements must be made with a great deal of precision. Inductive sensors places at each of the support plate (6) shall act as a safety device.

The fixed part of the plate (6) assembly with crossed movements is mounted for example on the drum support frame.

The operation of the device is as follows, emphasising that the cycle described is only given as an example:

height movement of the support plate (6) and consequently, the assembly of gripping components (gripper (1), carriage (5), rack (9), gear (10), in order to grip a determined and programmed number of wafers (W) positioned vertically in a carrier (P) (or a boat (N). The corresponding grippers are consequently driven in order to provide the gripping (FIG. 3).

movement in translation of the plate (6) with the assembly of gripping components (1), (5), (9), (10), towards the boat (N) for (or carriers (P), in order to transfer gripped wafers (N). During this transfer operation, the drive motor (12) of the stepped gears (10) is turned in either direction in order to start up, by moving the racks (9a) to which grippers (1) are fitted, the contraction or extension according to the case, of the pitch (P) of the gripped wafers in a continuous manner (FIG. 4).

positioning of the plate (6) and the assembly of gripping components above the boat (N) (or carrier (P) in a position of vertical alignment of the wafers (W) and the notches of the said boat (or said carrier) (FIG. 5).

lowering of the plate (6) and assembly of gripping components with respect to the boat (N) (or carrier) in order to position the wafers of the said boat (or said carrier) (FIG. 6).

As indicated, in order to provide the device with the maximum of reliability, it appeared important to check one of the supports, particularly the boat (N), more particularly the pitch of the notches, the positioning of the first notch and the deformation of the boat.

With this aim in mind, two sensors, more particularly the opto-electronic type with focused beam are mounted on a horizontal arm linked to a guiding table by a component likely to provide the adjustment in height of the said sensors. Furthermore, these two sensors are servocontrolled by a DC gear-motor with two operating directions so as to be move parallely with respect to the boat, particularly at the notches of the top bars of the said boat.

In addition, a sensor is provided to indicate the rpm of the motor to move the opto-eloectronic sensor.

The various information which is sensed, is entered in to a counting means so as to be processed and compared to reference values in order to indicate to the operator whether the boat thus checked is satisfactory or not.

The advantages are made clearly apparent by the description.

What is claimed is:

1. A device for transferring a plurality of vertically positioned spaced wafers from a first support means to a second remote support means comprising:

said first support means having a separate gripping means for each wafer;

each of said gripping means including upright clamping mens adapted and constructed to releasably clamp separately each of said wafers therebetween;

each of said gripping means being mounted on a separate spaced wheeled movable carriage means;

each of said carriage means mounted on a track means horizontally mounted on said first support means;

each of said carriage means being affixed to separate rack means;

rotatably driven cog gear means comprising a plurality of cog wheels each of a different diameter and a different pitch being mounted axially one to the other;

each of said rack means being operatively connected individually to one of said cog wheels whereby said carriage means may be given translation motion when said cog gear means is rotated;

said first support means having moving means whereby said support means is capable of being separately moved horizontally and vertically.

2. The device of claim 1 wherein the said clamping means terminate in notches wherein said wafers are supported thereby.

3. The device of claim 2 wherein a fixed gripping means is mounted at an end of said first support means.

4. The device of claim 1 wherein the pitch diameters Dp of the different cog wheels for each of the gripping means numbered from 2 to n are as follows:

for the gripping means No. 2: $Dp\ 2 = M2Z2$ for the gripping means No. 3: $Dp\ 3 = Dp\ 2 + \text{constant}$ for the gripping means No n: $Dp\ n = Dp\ n-1 + \text{constant}$ M being the module of the teeth of the gear and the corresponding rack, whereas Z is the number of teeth of the gears.

5. The device of claim 1 wherein sensor means are provided whereby the relative positions of the carriage means and of the position of the first support means may be determined to thereby move said first support means and each of said carriage means whereby said first support means may operatively cooperate with said second support means.

* * * * *